US008815616B2

(12) United States Patent
Bang et al.

(10) Patent No.: US 8,815,616 B2
(45) Date of Patent: Aug. 26, 2014

(54) SLIT VALVE UNIT AND FILM FORMING APPARATUS HAVING THE SAME

(71) Applicant: Samsung Electronics Co., Ltd., Gyeonggi-do (KR)

(72) Inventors: Sang Kyu Bang, Gyeonggi-do (KR); Sung Don Kwak, Gyeonggi-do (KR); Choo-Ho Kim, Gyeonggi-do (KR); Won Soo Ji, Gyeonggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 13/844,582

(22) Filed: Mar. 15, 2013

(65) Prior Publication Data

US 2014/0106478 A1   Apr. 17, 2014

(30) Foreign Application Priority Data

Oct. 16, 2012 (KR) .......................... 10-2012-0115063

(51) Int. Cl.
| | |
|---|---|
| *G01R 31/26* | (2014.01) |
| *B65G 53/46* | (2006.01) |
| *H01L 33/00* | (2010.01) |
| *C23C 16/455* | (2006.01) |
| *F16K 3/02* | (2006.01) |

(52) U.S. Cl.
CPC ............ *C23C 16/455* (2013.01); *H01L 33/005* (2013.01); *F16K 3/02* (2013.01)
USPC ............. 438/14; 414/217; 414/220; 414/221; 251/149; 118/686

(58) Field of Classification Search
USPC .......... 118/663–694, 715–733; 414/217–221; 251/142–204
See application file for complete search history.

(56) References Cited

U.S. PATENT DOCUMENTS

| | | | | |
|---|---|---|---|---|
| 5,562,800 | A  * | 10/1996 | Kawamura et al. | ............ 414/806 |
| 7,943,006 | B2 * | 5/2011  | Hoffman | .................. 156/345.31 |
| 2001/0040230 | A1* | 11/2001 | Yoo et al. | ........................ 251/326 |
| 2002/0070371 | A1* | 6/2002  | Kroeker et al. | ................ 251/195 |
| 2005/0268857 | A1* | 12/2005 | Bang et al. | ..................... 118/733 |

FOREIGN PATENT DOCUMENTS

| | | |
|---|---|---|
| JP | 2009-218477 A | 9/2009 |
| KR | 2003-0056749 A | 7/2003 |
| KR | 2006-0124792 A | 5/2006 |
| KR | 2009-0118088 A | 11/2009 |
| KR | 10-1088898 B1 | 12/2011 |

* cited by examiner

*Primary Examiner* — Fernando L Toledo
*Assistant Examiner* — Karen Kusumakar
(74) *Attorney, Agent, or Firm* — McDermott Will & Emery LLP

(57) ABSTRACT

There is provided a slit valve unit including: a body disposed on an outer side of a process chamber and having an entrance connected to an opening of the process chamber; a slit valve provided in an internal space of the body and selectively opening and closing the entrance; a plurality of packing members provided along the circumference of the entrance on an inner side of the body and tightly attached to the slit valve when the slit valve shields the entrance; and a connection pipe having one end exposed between the plurality of packing members on the inner side of the body so as to be connected to an airtight space formed among the plurality of packing members, the body, and the slit valve, and the other end exposed to the outer side of the body, the connection pipe penetrating the body.

17 Claims, 14 Drawing Sheets

SLIT VALVE UNIT AND FILM FORMING APPARATUS HAVING THE SAME

CROSS-REFERENCE TO RELATED APPLICATION

This application claims the priority of Korean Patent Application No. 10-2012-0115063 filed on Oct. 16, 2012, in the Korean Intellectual Property Office, the disclosure of which is incorporated herein by reference.

BACKGROUND

1. Field

The present inventive concept relates to a slit valve unit and a film forming apparatus having the same.

2. Description of the Related Art

Among vapor deposition apparatuses used to grow single crystals of a semiconductor layer of a light emitting diode (LED), a metal organic chemical vapor deposition (MOCVD) apparatus allows for the growth of single crystals on a sapphire wafer while using a relatively large amount of combustible, explosive, hydrogen (H2) or ammonia gasses, in a high temperature and low pressure state.

Recently, as the diameter of wafers has tended to be increased, a process of mounting and transferring wafers has been switched from a manual operation to an automated operation, and to this end, it is necessary to form holes in partitions to transfer wafers therethrough and which are shut during a crystal growth operation to prevent a dangerous gas such as hydrogen gas from being leaked, to thus secure process stability.

However, hydrogen gas may even be leaked through fine holes in a high temperature and high pressure state, and the leaked hydrogen gas may readily explode, even with an oxygen concentration that may work an ignition source to cause a safety accident.

SUMMARY

An aspect of the present inventive concept provides a slit valve unit capable of selectively opening and closing an opening of a process chamber and detecting a leakage of a dangerous gas from the process chamber to prevent an accident, and a film forming apparatus having the same.

According to an aspect of the present inventive concept, there is provided a slit valve unit including: a body disposed on an outer side of a process chamber and having an entrance connected to an opening of the process chamber; a slit valve provided in an internal space of the body and selectively opening and closing the entrance; a plurality of packing members provided along the circumference of the entrance on an inner side of the body and tightly attached to the slit valve when the slit valve shields the entrance; and a connection pipe having one end exposed between the plurality of packing members on the inner side of the body so as to be connected to an airtight space formed among the plurality of packing members, the body, and the slit valve, and the other end exposed to the outer side of the body, the connection pipe penetrating the body.

The plurality of packing members may include a first O-ring and a second O-ring spaced apart from one another and concentrically disposed, wherein an interval defining the space may exist between the first and the second O-rings.

The airtight space may be provided along the circumference of the entrance between the first and second O-rings.

The slit valve unit may further include: a sensor unit monitoring a state of the airtight space formed between the plurality of packing members in a state in which the plurality of packing members are tightly attached to the slit valve.

The sensor unit may sense a pressure within the airtight space and the presence or absence of hydrogen gas leaked from the process chamber.

The slit valve unit may further include an air exhaust unit exhausting air within the airtight space outwardly and a supply unit supplying a buffer gas to the space.

The slit valve unit may further include a controller controlling an operation of the air exhaust unit or the supply unit.

The slit valve unit may further include a driving unit connected to the slit valve to drive the slit valve to open and close the entrance.

According to another aspect of the present inventive concept, there is provided a method for depositing a semiconductor layer of a light emitting diode (LED), the method comprising: shielding an entrance of a slit valve unit connected to an opening of a process chamber by a slit valve driven by a driving unit; performing a deposition process of injecting a reactive gas into a wafer placed within the process chamber to grow a semiconductor layer for an LED on a surface of the wafer; and opening the entrance by driving the slit valve in order to remove the wafer on which the semiconductor layer is completely deposited from the process chamber, wherein the slit valve unit includes a body disposed on an outer side of the process chamber, a plurality of packing members provided along the circumference of the entrance on an inner side of the body and tightly attached to the slit valve when the slit valve shields the entrance, and a connection pipe having one end exposed between the plurality of packing members so as to be connected to an airtight space formed among the plurality of packing members, the body, and the slit valve, and the other end exposed to the outer side of the body, thereby penetrating the body.

The shielding of the entrance of the slit valve unit comprises: exhausting air from within the airtight space formed among the packing members, the body and the slit valve, outwardly through an air exhaust unit; sensing a pressure within the airtight space through a sensor unit; and controlling an operation of the air exhaust unit based on a signal transferred from the sensor unit through a controller.

The performing of a deposition process comprises: monitoring a state of the interior of the airtight space formed among the packing members, the body, and the slit valve through the sensor unit; and exhausting air from within the interior of the airtight space by operating the air exhaust unit through the controller based on a signal according to an abnormal state transferred from the sensor unit.

The monitoring of a state of the interior of the airtight space includes at least one of detecting pressure of the airtight space and a change in the space, detecting leakage of hydrogen gas or ammonia gas from the process chamber, and detecting an inflow of air from the outside.

When an abnormal state occurs, the controller stops operations of the process chamber, and when pressure within the airtight space reaches a stabilized state due to the air exhaust unit, the controller re-starts operations of the process chamber.

The opening of the entrance comprises: supplying a buffer gas to the airtight space via the connection pipe through a supply unit driven by the controller.

The method may further comprise: determining whether pressure within the airtight space has reached a pressure level sufficient for opening the entrance through a sensor unit, after the supplying of the buffer gas.

BRIEF DESCRIPTION OF THE DRAWINGS

The above and other aspects, features and other advantages of the present inventive concept will be more clearly understood from the following detailed description taken in conjunction with the accompanying drawings, in which.

DETAILED DESCRIPTION OF THE PREFERRED EMBODIMENT

Figure 1A:
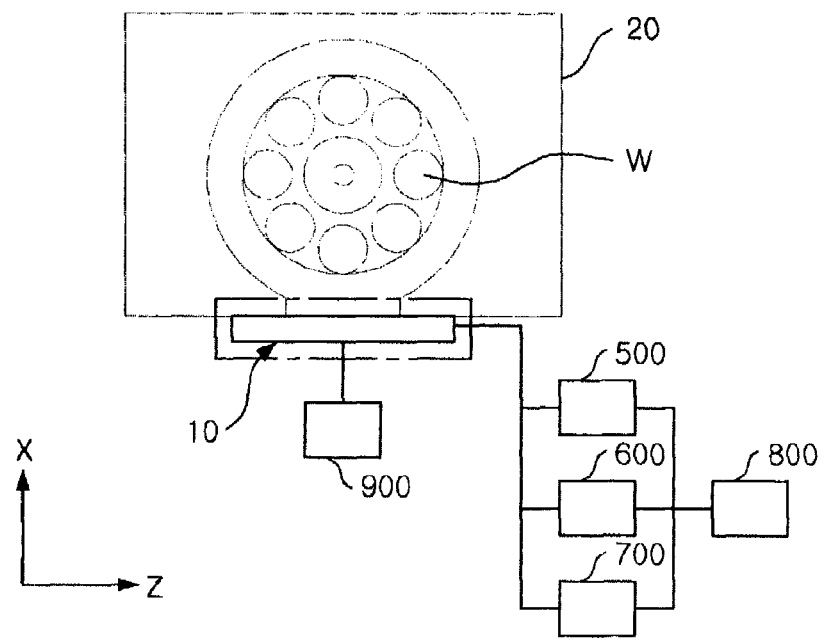
FIGS. 1A and 1B are a plan view and a cross-sectional view schematically illustrating a slit valve unit according to an embodiment of the present inventive concept.

Embodiments of the present inventive concept will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like components.

Figure 1B:
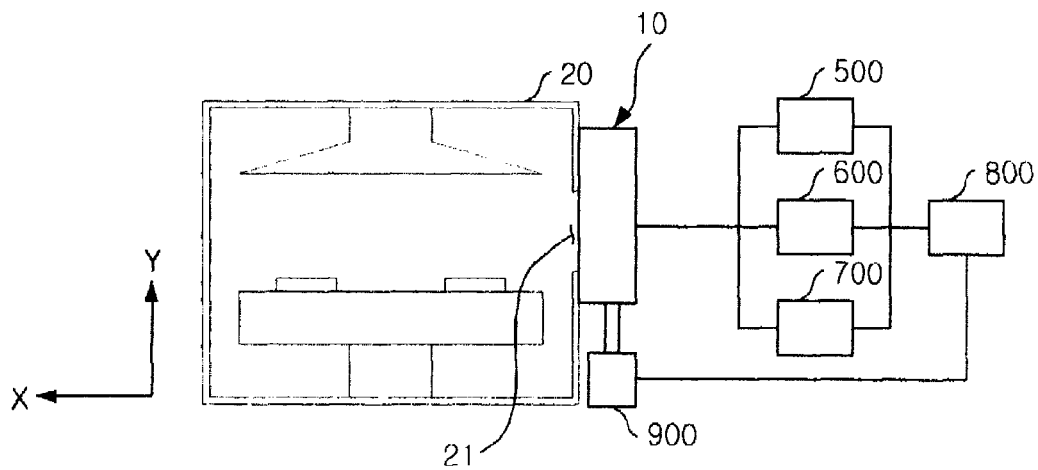
Figure 2:
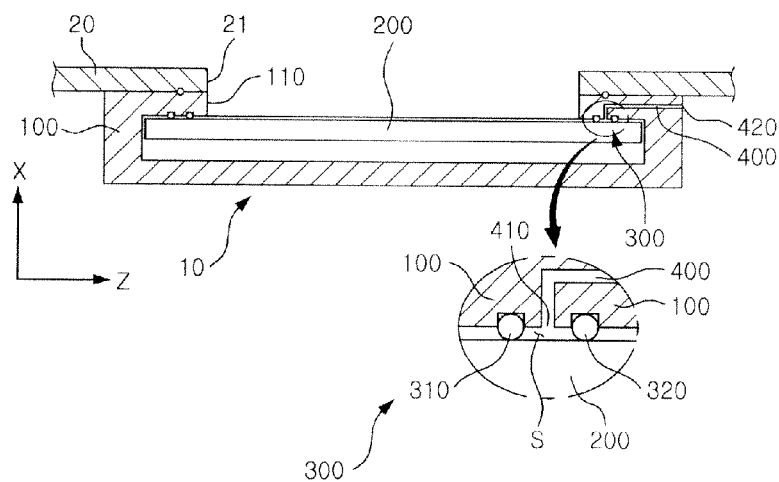
FIG. 2 is an enlarged plan view of the slit valve unit in FIG. 1.
Figure 3:
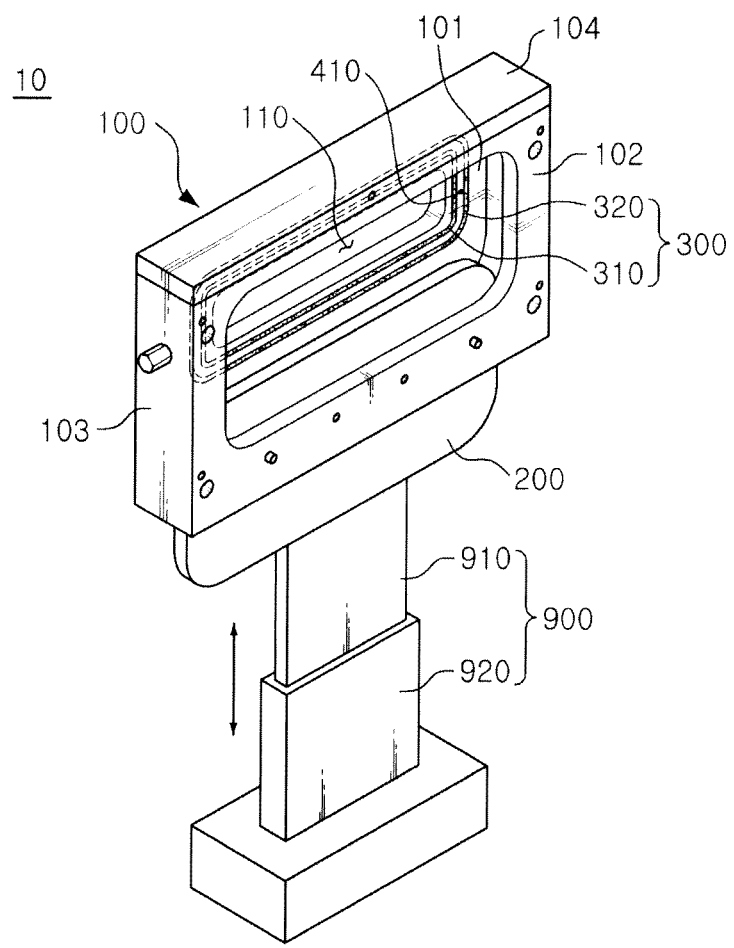
FIG. 3 is a schematic perspective view of the slit valve unit of FIG. 2.
Figure 4:
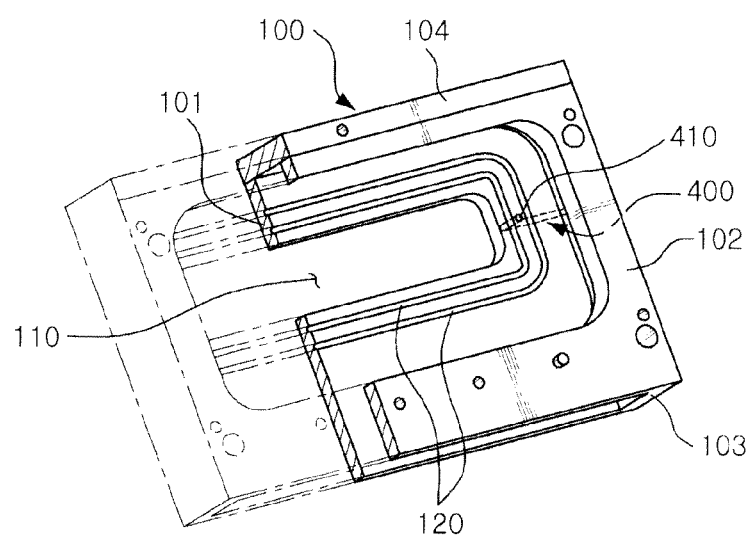
FIG. 4 is a schematic cutaway perspective view of a body in FIG. 3.
Figure 5A:
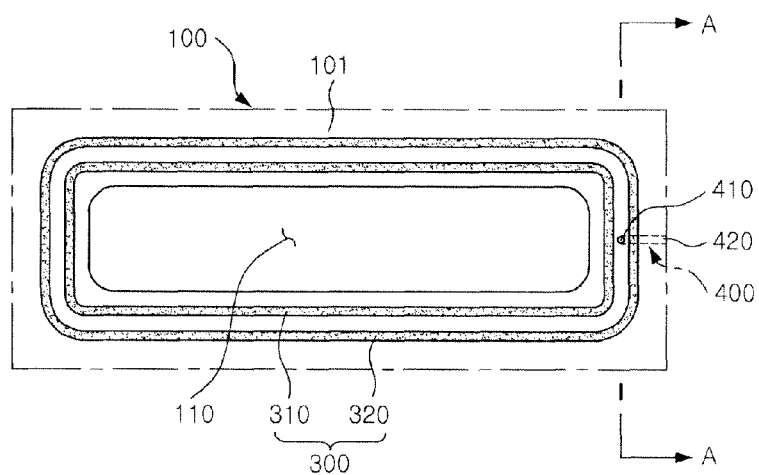
FIGS. 5A and 5B are schematic views illustrating a structure including a packing member and a connection pipe in FIG. 3.
Figure 5B:
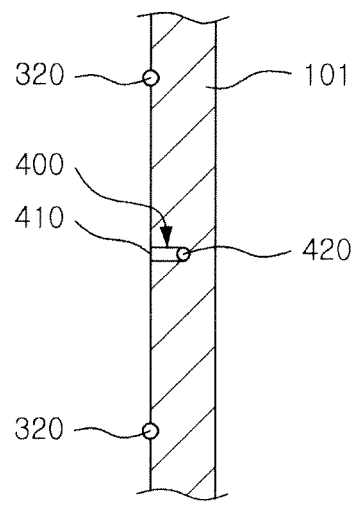
Figure 6:
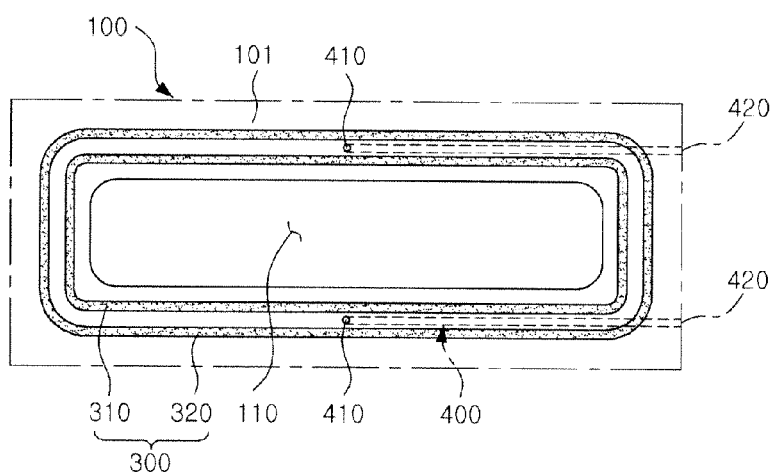
FIG. 6 is a schematic view of a structure including a plurality of connection pipes in FIG. 5.

FIGS. 1 through 6 illustrate a slit value unit according to an embodiment of the present inventive concept. FIG. 1 is a schematic view of the slit valve unit according to an embodiment of the present inventive concept. FIG. 2 is an enlarged plan view of the slit valve unit in FIG. 1. FIG. 3 is a schematic perspective view of the slit valve unit of FIG. 2. FIG. 4 is a schematic cutaway perspective view of a body in FIG. 3. FIGS. 5A and 5B are schematic views illustrating a structure including a packing member and a connection pipe in FIG. 3. FIG. 6 is a schematic view of a structure including a plurality of connection pipes in FIG. 5.

Referring to FIGS. 1 through 6, a slit valve unit 10 according to an embodiment of the present inventive concept may include a body 100, a slit valve 200, a packing member 300, and a connection pipe 400, and may further include a sensor unit 500, an air exhaust unit 600, and a supply unit 700 connected to the connection pipe 400.

The body 100 may be disposed outside a process chamber 20. In detail, the body 100 may be detachably attached to an outer surface of the process chamber 20.

The body 100 may have a housing structure having an internal space. In detail, the body 100 may have a first surface 101 and a second surface 102 opposing one another, and a pair of lateral surfaces 103 and an upper surface 104 connecting the first surface 101 and the second surface 102. A lower surface may be selectively provided, and in the present embodiment, a lower surface is omitted and a lower portion of the body 100 is opened.

The process chamber 20 having the body 100 disposed outside thereof may be a single crystal growing furnace for growing a semiconductor thin film on a surface of a wafer W placed therein through a reactive gas supplied from the outside. The process chamber 20 may have an opening 21 formed on one surface thereof. The opening 21 allows the wafer W to be transferred therethrough.

An entrance 110 connected to the opening 21 may be formed on one surface (e.g., the first surface 101) of the body 100 disposed outside the process chamber 20. The entrance 110 may have a size and shape corresponding to the opening 21. Thus, the wafer W may be supplied to the interior of the process chamber 20 through the entrance 110 and the opening 21, or may be taken out from the process chamber 20.

The slit valve 200 may be provided within an internal space of the body 100 to selectively open and close the entrance 110. The slit valve 200 may have a shape corresponding to the entrance 110 and may have a size greater than that of the entrance 110 to cover the entrance 110 and a peripheral region of the entrance 110, thus covering the entrance 110.

The slit valve 200 may be connected to a driving unit 900 to open and close the entrance 110. The driving unit 900 may include a rod 910 having one end connected to the slit valve 200 and reciprocating vertically and an actuator 920 connected to the other end of the rod 910 to move the rod 910.

The packing member 300 may be provided along the circumference of the entrance 110 on an inner side of the body 100. When the slit valve 200 shields the entrance 110, the packing member 300 is tightly attached to the slit valve 200 to thus hermetically seal the entrance 110.

As illustrated, a plurality of packing members 300 may be provided on an inner side of the first surface 101 attached to the process chamber 20, and in this case, the plurality of packing members 300 may have a structure of surrounding the entrance 110 concentrically based on the entrance 110. In detail, the plurality of packing members 300 may include a first O-ring 310 and a second O-ring 320 disposed to be spaced apart from one another concentrically based on the entrance 110. Namely, the first O-ring 310 may be provided to surround the entrance 110, and the second O-ring 320 may be provided to be spaced apart from the first O-ring 310 by a certain interval and surround the first O-ring 310.

In the present embodiment, a case in which two packing members 300, i.e., the first O-ring 310 and the second O-ring 320, are provided is illustrated but the present inventive concept is not limited thereto. For example, three or more packing members 300 may be provided.

In a state in which the slit valve 200 is tightly attached to the plurality of packing members 300, an airtight space S may be formed among the plurality of packing members 300, the body 100, and the slit valve 200. Namely, an interval defining the space S exists between the first and second O-rings 310 and 320, and the air-tight space S may be formed as the first and second O-rings 310 and 320 are tightly attached between the body 100 and the slit valve 200.

The airtight space S may have a structure that it surrounds the entrance 110 along the circumference of the entrance 110 between the first and second O-rings 310 and 320.

Meanwhile, as illustrated in FIG. 4, in order to fix the plurality of packing members 300, grooves 120 may be formed to have a predetermined depth on an inner surface of the body 100 to allow the plurality of packing members 300 to be insertedly fixed therein. The grooves 120 may be spaced apart from the entrance 110 by a predetermined distance and surround the entrance 110. A plurality of grooves 300 corresponding to the amount of the packing members 300 may be provided.

The connection pipe 400 has one end 410 exposed to the inner side of the body 100 and the other end 420 exposed to the outer side of the body 100. Namely, the connection pipe 400 may penetrate the body 100. In detail, one end 410 of the connection pipe 400 is exposed between the first O-ring 310 and the second O-ring 320 in the inner side of the body 100 and connected to the airtight space S formed between the plurality of packing members 300, the body 100, and the slit valve 200. The other end 420 of the connection pipe 400 may be exposed to an outer side of any one of lateral surfaces of the body 100 and connected to the outside.

At least one connection pipe 400 may be provided to penetrate the body 100. As illustrated in FIGS. 5A and 5B, the connection pipe 400 may be provided as a single pipe. Also, as illustrated in FIG. 6, two connection pipes 400 may be provided to be symmetrical, based on the entrance 110. In the present embodiment, it is illustrated that a single connection pipe 400 or two connection pipes 400 are provided, but the present inventive concept is not limited thereto and three or more connection pipes may be provided.

The sensor unit 500 may be connected to the connection pipe 400 on an outer side of the body 100. In a state in which the plurality of packing members 300 are tightly attached to the slit valve 200, the sensor unit 500 may monitor a state of the airtight space S formed between the plurality of packing members 300. For example, the sensor unit 500 may sense pressure within the airtight space S, the presence or absence of hydrogen gas or ammonia gas leaked from the process chamber 20, and the like.

The sensor unit 500 may include a pressure transducer detecting a pressure within the airtight space S and a change in the pressure. The sensor unit 500 may sense whether the airtight space S is in a pre-set pressure state, whether the pre-set pressure is maintained in the airtight space S, and the like. Here, the space S may be in a low pressure state of in a vacuum state in order to secure adhesion of the slit valve 200.

The sensor unit 500 may include a hydrogen gas sensor for sensing the presence or absence of hydrogen gas leaked to the airtight space S or an ammonia gas sensor for sensing the presence or absence of an ammonia gas leaked to the airtight space S.

The air exhaust unit 600 may be connected to the connection pipe 400 on an outer side of the body 100. The air exhaust unit 600 may exhaust air within the airtight space S to the outside to lower a pressure within the airtight space S. For example, the space S may be changed into a vacuum state (or a state close to vacuum), thereby increasing adhesion of the slit valve 200.

Also, the air exhaust unit 600 may adjust a pressure within the airtight space S to reach a pre-set pressure. In this case, a pressure within the airtight space S may be checked by the sensor unit 500.

Meanwhile, when hydrogen gas or an ammonia gas is leaked from the process chamber 20 and introduced to the airtight space S, the air exhaust unit 600 may exhaust it outwardly, preventing an accident that may be caused by the hydrogen gas or ammonia gas.

The air exhaust unit 600 may include a vacuum pump.

The supply unit 700 may be connected to the connection pipe 400 on an outer side of the body 100. The supply unit 700 may supply a buffer gas to the airtight space S. When the entrance 110 is opened after the operation of the process chamber 20 is terminated, the supply unit 700 may reduce adhesion of the slit valve 200 to allow the slit valve 200 to be separated from the plurality of packing members 300.

In detail, the supply unit 700 may supply a buffer gas to the airtight space S to allow the space S to be filled with the buffer gas, thus changing a pressure within the space S into an atmospheric pressure level. Thus, adhesion due to the low pressure (i.e., a vacuum level) acting on the slit valve 200 is weakened as the pressure is increased, and the slit valve 200 may easily be separated to open the entrance 110.

As the buffer gas, for example, a nitrogen ($N_2$) gas may be used. Whether a pressure within the space S has reached a pressure level sufficient to operate the slit valve 200 may be checked by the sensor unit 500.

Operations of the air exhaust unit 600 and the supply unit 700 may be controlled by a controller 800. The controller 800 may be connected to the sensor unit 500, the air exhaust unit 600, and the supply unit 700, and control operations of the air exhaust unit 600 and/or the supply unit 700 according to a signal transferred from the sensor unit 500. The controller 800 may include an automation device constituting a computer.

In detail, the controller 800 may check a pressure state of the space S through a signal transferred from the sensor unit 500 and control whether to operate the air exhaust unit 600. For example, when a pressure within the airtight space S reaches a pre-set pressure (or vacuum), the controller 800 may stop an operation of the air exhaust unit 600 and maintain the pressure.

Also, when hydrogen gas, or the like, is leaked from the process chamber 20 and introduced to the airtight space S, pressure within the space S is changed (increased). Thus, the sensor unit 500 senses the change and transmits a signal to the controller 800. The controller 800 then drives the air exhaust unit 600 to exhaust air within the space S outwardly. Accordingly, the pressure within the space S may be maintained and an explosion accident, or the like, due to the leaked hydrogen gas can be prevented in advance.

Meanwhile, in the case that the wafer W with a semiconductor thin film grown thereon is required to be taken out as a deposition process in the process chamber 20 is terminated, the controller 800 may drive the supply unit 700 to perform a procedure of opening the entrance 100 of the body 100. Accordingly, the pressure within the airtight space S may be changed into an atmospheric pressure level, weakening adhesion acting on the slit valve 200, and thus, the slit valve 200 is moved by means of the driving unit 900 to open the entrance 110.

A driving principle of the slit valve unit according to an embodiment of the present inventive concept will be described with reference to FIGS. 7A through 7E. FIGS. 7A through 7E are schematic views illustrating a driving principle of the slit valve unit by stages according to an embodiment of the present inventive concept.

Figure 7A:
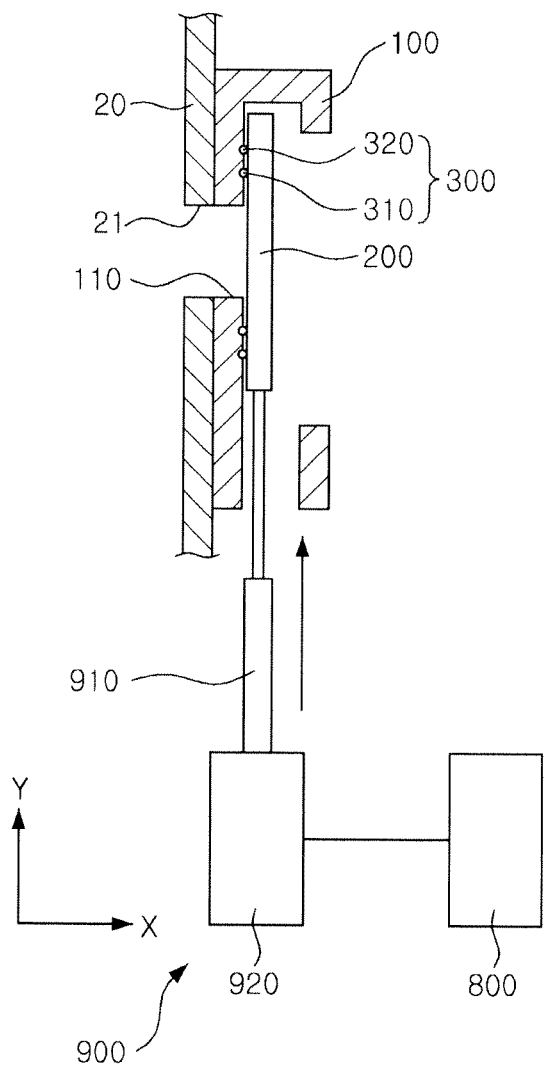
FIGS. 7A through 7E are schematic views illustrating a driving principle of the slit valve unit by stages according to an embodiment of the present inventive concept.

First, as illustrated in FIG. 7A, before the deposition process is performed in the process chamber 20, the entrance 110 connected to the opening 21 of the process chamber 20 is required to be completely shielded. To this end, the driving unit 900 may move the slit valve 200 to cover the entrance 100 through the rod 910.

The slit valve 200 may be moved from the body 100 downwardly so as to be disposed at a position facing the entrance 110, and tightly attached to an inner surface of the body 100 to shield the entrance 110. In detail, the packing member 300 is interposed between the body 100 and the slit valve 200 and the slit valve 200 is tightly attached to the packing member 300, and a predetermined gap may exist between the body 100 and the slit valve 200 due to the presence of the packing member 200.

Figure 7B:
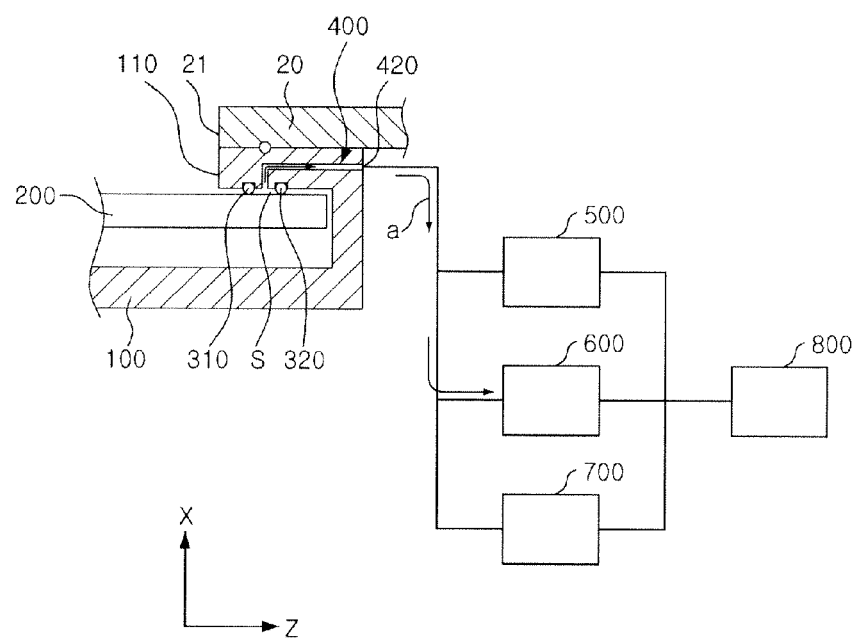

Next, as illustrated in FIG. 7B, the controller 800 drives the air exhaust unit 600 to exhaust air (a) within the airtight space S formed among the packing member 300, the body 100, and the slit valve 200 outwardly through the connection pipe 400. As the air (a) within the airtight space S is exhausted outwardly, pressure within the space S is lowered to a vacuum or to a state close to a vacuum to generate adhesion allowing the slit valve 200 to be firmly tightly attached and fixed to the packing member 300. Thus, since the slit valve 200 is firmly tightly attached to the inner surface of the body 100, the entrance 110 including the opening 21 is completely shielded to hermetically seal the process chamber 20.

The sensor unit 500 may sense whether a pressure within the space S has reached a pre-set pressure (e.g., a vacuum), and the controller 800 may stop the air exhaust unit 600 according to a pertinent signal transferred from the sensor unit 500.

Figure 7C:
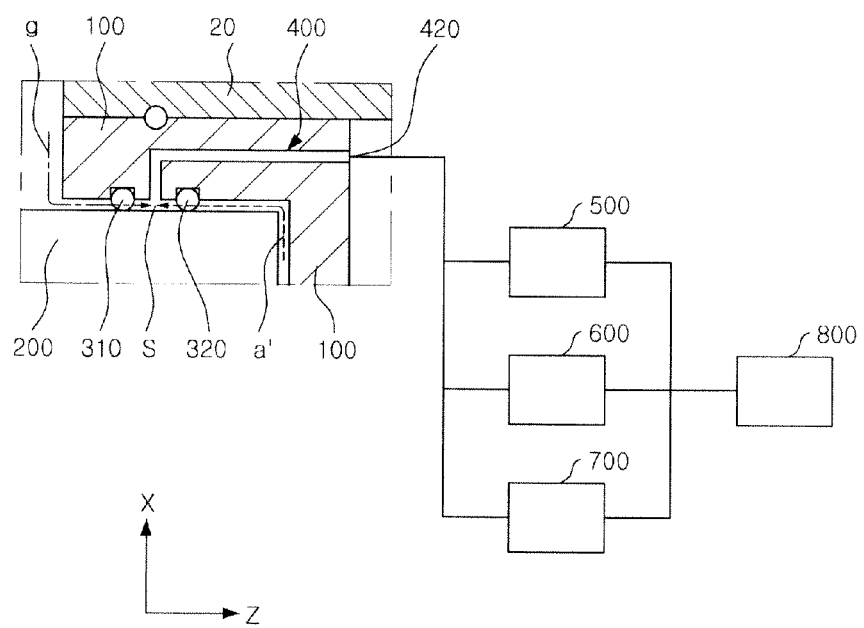

Next, as illustrated in FIG. 7C, when the pressure within the airtight space S, having been maintained in a predetermined low pressure state, is changed, the sensor unit 500 senses such a change in the pressure and transmits a pertinent signal to the controller 800.

The change in the pressure within the airtight space S may be made when a gas is introduced to the space S from the outside. Namely, when gas leakage occurs as a gas (g), e.g., hydrogen gas or ammonia gas, is introduced from the process chamber 20 to the airtight gas S between the packing members 300 while the deposition process is being performed in the process chamber 20, the pressure within the space S is increased.

Also, in case that air (a') is introduced to the space S from the outside, the pressure within the space S is increased. The introduction of the gas (g) or air (a') may occur if a perfect sealing state is not maintained because the packing members 300 have been corroded or abraded or when the packing members 300 have reached a limit life span.

Besides the change in pressure within the airtight space S, in the case that hydrogen gas or ammonia gas is leaked, the sensor unit 500 may sense the leakage of hydrogen gas or ammonia gas through the hydrogen gas sensor, the ammonia gas sensor, or the like. The controller 800 may then transmit a signal indicating the leakage of a gas.

Thereafter, when the controller 800 determines that a current situation is a dangerous situation based on the signal from the sensor unit 500, the controller 800 may stop the operation of the process chamber 20 and operate the air exhaust unit 600 to exhaust gas (or air) within the space S as illustrated in FIG. 7.

In this manner, since the gas within the airtight space S is exhausted outwardly, an occurrence of an explosion accident due to an increase in a pressure or hydrogen gas can be prevented to prevent material damage and human injuries.

When a stabilized state has reached as the harmful gas has been exhausted outwardly from the space S or the pressure has been lowered, the process chamber 20 is re-actuated to resume the deposition process. Alternatively, a wafer determined to be defective due to the stoppage of the deposition process may be replaced with a new wafer by opening the entrance 110, and a deposition process may be newly performed.

Figure 7D:
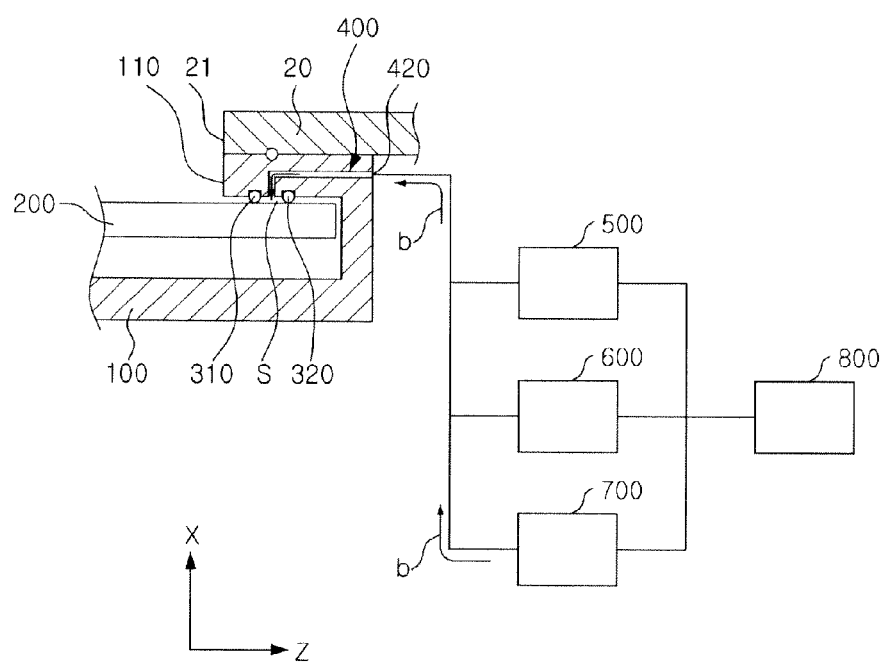
Figure 7E:
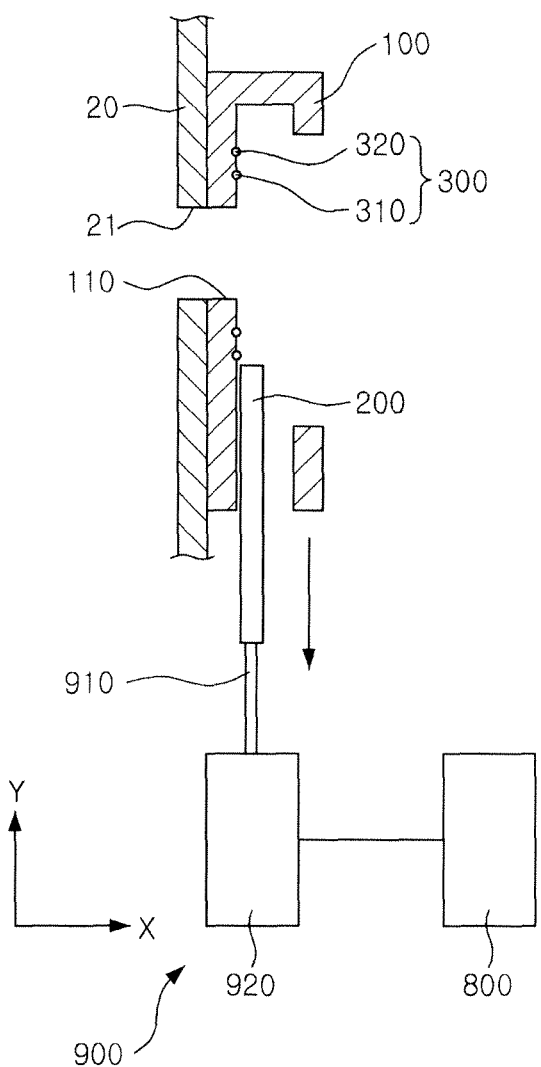

Thereafter, as illustrated in FIG. 7D, when the deposition process in the process chamber 20 is completed (or when a defective wafer due to the stoppage of the deposition process is replaced with a new wafer), the controller 800 may drive the supply unit 700 to supply the buffer gas (b) to the airtight space S.

As the space S is filled with the buffer gas (b), an internal pressure within the space S is increased to an atmospheric pressure level, and thus, adhesion acting on the slit valve 200 is weakened.

When it is determined by the sensor unit 500 that the pressure within the space S has reached a pre-set pressure, the controller 800 may drive the slit valve 200 by means of the driving unit 900 to open the entrance 110.

When the entrance 110 is opened according to a movement of the slit valve 200, the wafer W which has completely undergone a thin film deposition within the process chamber 20 is taken out through a device such as a robot arm, and a new wafer is supplied to the process chamber 20 and a deposition process is performed thereon.

In this manner, the slit valve unit 10 may selectively automatically open and close the entrance 110 connected to the opening 21 of the process chamber 20 to serve to isolate a low pressure environment and a normal pressure environment, and monitor the presence or absence of hydrogen gas or ammonia gas leaked from the process chamber 20 to prevent an accident.

Figure 8:
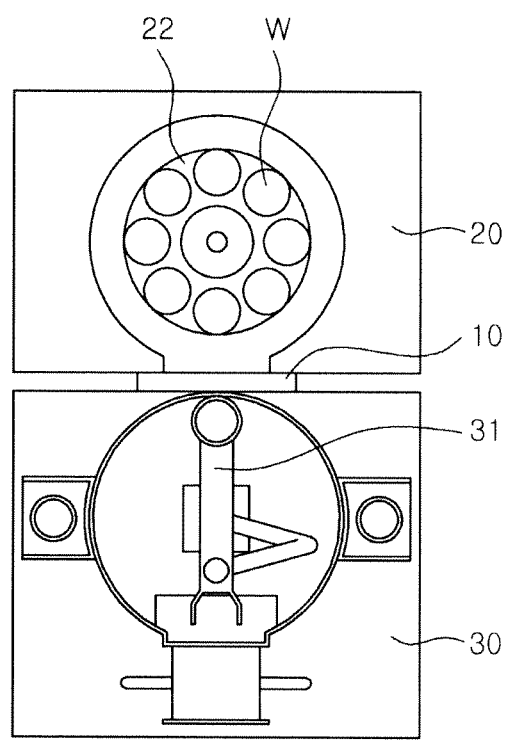
FIG. 8 is a schematic plan view of a film forming apparatus according to an embodiment of the present inventive concept.
Figure 9:
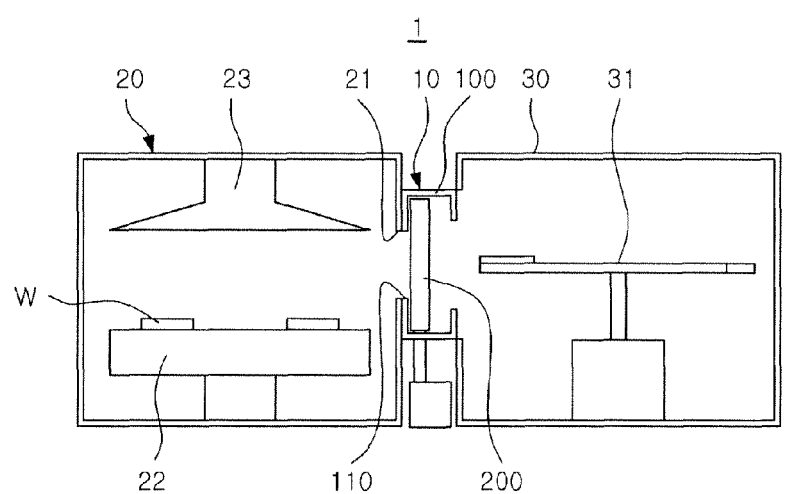
FIG. 9 is a cross-sectional view of the film forming apparatus of FIG. 8.

FIGS. 8 and 9 schematically illustrate a film forming apparatus according to an embodiment of the present inventive concept. FIG. 8 is a schematic plan view of a film forming apparatus according to an embodiment of the present inventive concept. FIG. 9 is a cross-sectional view of the film forming apparatus of FIG. 8.

Referring to FIGS. 8 and 9, a film forming apparatus 1 according to an embodiment of the present inventive concept may include a slit valve unit 10, a process chamber 20, and a transfer chamber 30.

The process chamber 20 may be a single crystal growth furnace for growing a semiconductor thin film on a surface of the wafer W placed therein with a reactive gas supplied from the outside. The process chamber 20 may include a susceptor 22 on which the wafer W is placed and a gas injection unit 23 injecting the reactive gas to the wafer W. The opening 21 may be formed on one surface of the process chamber 20, as a passage for the entry of the wafer W.

The transfer chamber 30 may supply the wafer W to the process chamber 20 through the opening 21 or carry out the wafer W from the process chamber 20. The transfer chamber 30 may include a transfer device 31 clamping and declamping the wafer W and extending into the process chamber 20 through the opening 21. The transfer device 31 may include a robot arm.

The slit valve unit 10 may be disposed between the process chamber 20 and the transfer chamber 30 to selectively open and close the opening 21. The slit valve unit 10 may include the body 100, the slit valve 200, the packing member 300, and the connection pipe 400. The entrance 119 connected to the opening 21 may be provided on one surface of the body 100 attached to an outer side of the process chamber 20.

The entrance 110 may be selectively opened and closed through the slit valve 200 provided in the internal space of the body 100. The slit valve 200 may have a shape corresponding to the entrance 110. The slit valve 200 may have a size greater than that of the entrance 110. Namely, the slit valve may have a structure covering the entrance 110 and a peripheral region of the entrance 110, to thus cover the entrance 110.

A specific configuration of the slit valve unit 10 is disclosed in FIGS. 2 through 6 and a specific operation thereof has been described above with reference to FIGS. 7A through 7E, so a detailed description thereof will be omitted.

As set forth above, according to embodiments of the invention, the slit valve unit capable of preventing an accident by selectively opening of the process chamber and sensing leakage of a dangerous gas from the process chamber, and the film forming apparatus having the same can be provided.

Various advantages of the present inventive concept are not limited to the foregoing content and may be easily understood in the process of describing specific embodiments of the present inventive concept.

While the present inventive concept has been shown and described in connection with the embodiments, it will be apparent to those skilled in the art that modifications and variations can be made without departing from the spirit and scope of the invention as defined by the appended claims.

What is claimed is:

1. A slit valve unit comprising:
   a body disposed on an outer side of a process chamber and having an entrance connected to an opening of the process chamber;
   a slit valve provided in an internal space of the body and selectively opening and closing the entrance;
   a plurality of packing members provided along the circumference of the entrance on an inner side of the body and tightly attached to the slit valve when the slit valve shields the entrance;
   a connection pipe having one end exposed between the plurality of packing members on the inner side of the body so as to be connected to an airtight space formed among the plurality of packing members, the body, and the slit valve, and the other end exposed to the outer side of the body, the connection pipe penetrating the body; and
   an air exhaust unit exhausting air within the airtight space outwardly and a supply unit supplying a buffer gas to the space.

2. The slit valve unit of claim 1, wherein the plurality of packing members comprise a first O-ring and a second O-ring spaced apart from one another and concentrically disposed, wherein an interval defining the space exists between the first and the second O-rings.

3. The slit valve unit of claim 2, wherein the airtight space is provided along the circumference of the entrance between the first and second O-rings.

4. The slit valve unit of claim 1, further comprising a sensor unit monitoring a state of the airtight space formed between the plurality of packing members in a state in which the plurality of packing members are tightly attached to the slit valve.

5. The slit valve unit of claim 4, wherein the sensor unit senses a pressure within the airtight space and the presence or absence of hydrogen gas leaked from the process chamber.

6. The slit valve unit of claim 1, further comprising a controller controlling an operation of the air exhaust unit or the supply unit.

7. The slit valve unit of claim 1, further comprising a driving unit connected to the slit valve to drive the slit valve to open and close the entrance.

8. A method for depositing a semiconductor layer of a light emitting diode (LED), the method comprising:
   shielding an entrance of a slit valve unit connected to an opening of a process chamber by a slit valve driven by a driving unit;
   performing a deposition process of injecting a reactive gas onto a wafer placed within the process chamber to grow a semiconductor layer for an LED on a surface of the wafer; and
   opening the entrance by driving the slit valve in order to remove the wafer on which the semiconductor layer is completely deposited from the process chamber, wherein:
   the slit valve unit includes a body disposed on an outer side of the process chamber, a plurality of packing members provided along the circumference of the entrance on an inner side of the body and tightly attached to the slit valve when the slit valve shields the entrance, and a connection pipe having one end exposed between the plurality of packing members so as to be connected to an airtight space formed among the plurality of packing members, the body, and the slit valve, and the other end exposed to the outer side of the body, thereby penetrating the body, and
   the performing of a deposition process comprises:
      monitoring a state of the interior of the airtight space formed among the packing members, the body, and the slit valve through a sensor unit; and
      exhausting air from within the interior of the airtight space by operating an air exhaust unit through a controller based on a signal according to an abnormal state transferred from the sensor unit.

9. The method of claim 8, wherein the shielding of the entrance of the slit valve unit comprises:
   exhausting air from within the airtight space formed among the packing members, the body and the slit valve, outwardly via the connection pipe through an air exhaust unit;
   sensing a pressure within the airtight space through a sensor unit; and
   controlling an operation of the air exhaust unit based on a signal transferred from the sensor unit through a controller.

10. The method of claim 8, wherein the monitoring of a state of the interior of the airtight space includes at least one of detecting pressure of the airtight space and a change in the space, detecting leakage of hydrogen gas or ammonia gas from the process chamber, and detecting an inflow of air from the outside.

11. The method of claim 8, wherein when an abnormal state occurs, the controller stops operations of the process chamber, and when pressure within the airtight space reaches a stabilized state due to the air exhaust unit, the controller re-starts operations of the process chamber.

12. The method of claim 8, wherein the opening of the entrance comprises: supplying a buffer gas to the airtight space via the connection pipe through a supply unit driven by a controller.

13. The method of claim 12, further comprising: determining whether pressure within the airtight space has reached a pressure level sufficient for opening the entrance through a sensor unit, after the supplying of the buffer gas.

14. A film forming apparatus, comprising
   a process chamber having an opening on a surface of the process chamber;
   a transfer chamber configured to supply a wafer to the process chamber through the opening or carry out the wafer from the process chamber; and
   a slit valve unit disposed between the process chamber and the transfer chamber and configured to selectively open and close the opening, wherein:
   the slit valve unit includes:
      a body disposed on an outer side of the process chamber and having an entrance connected to the opening of the process chamber;

a slit valve disposed in an internal space of the body and selectively opening and closing the entrance;

a plurality of packing members disposed along the circumference of the entrance on an inner side of the body and tightly attached to the slit valve when the slit valve shields the entrance;

a connection pipe having one end exposed between the plurality of packing members on the inner side of the body to be connected to an airtight space formed among the plurality of packing members, the body, and the slit valve, the connection pipe having the other end exposed to an outer side of the body, the connection pipe penetrating the body;

an air exhaust unit configured to exhaust air within the airtight space outwardly; and a supply unit configured to supply a buffer gas to the airtight space.

15. The film forming apparatus of claim 14, wherein:

the plurality of packing members comprise a first O-ring and a second O-ring spaced apart from one another and concentrically disposed, and an interval defining a space exists between the first and the second O-rings.

16. The film forming apparatus of claim 14, wherein the slit valve unit further includes a sensor unit configured to monitor a state of the airtight space formed between the plurality of packing members when the plurality of packing members are tightly attached to the slit valve.

17. The film forming apparatus of claim 14, wherein the slit valve unit further includes a driving unit connected to the slit valve and configured to drive the slit valve to open and close the entrance.

\* \* \* \* \*